(12) United States Patent
Byeon et al.

(10) Patent No.: US 7,692,967 B2
(45) Date of Patent: Apr. 6, 2010

(54) METHOD OF PROGRAMMING A NONVOLATILE MEMORY DEVICE USING HYBRID LOCAL BOOSTING

(75) Inventors: Dae-Seok Byeon, Yongin-si (KR); Young-ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 361 days.

(21) Appl. No.: 11/776,729

(22) Filed: Jul. 12, 2007

(65) Prior Publication Data

US 2008/0025098 A1 Jan. 31, 2008

(30) Foreign Application Priority Data

Jul. 25, 2006 (KR) ...................... 10-2006-0069977

(51) Int. Cl.
*G11C 11/34* (2006.01)

(52) U.S. Cl. ............................ 365/185.18; 365/185.02; 365/185.28; 365/185.25; 365/185.17; 365/185.23

(58) Field of Classification Search ............ 365/185.18, 365/185.02, 185.17, 185.25, 185.28, 185.29, 365/185.23
See application file for complete search history.

(56) References Cited

U.S. PATENT DOCUMENTS 6,154,391 A * 11/2000 Takeuchi et al. ....... 365/185.24

7,099,193 B2 * 8/2006 Futatsuyama .......... 365/185.17

FOREIGN PATENT DOCUMENTS

| JP | 2000048581 | 2/2000 |
| JP | 2004185690 | 7/2004 |
| KR | 1020040036015 A | 4/2004 |

* cited by examiner

*Primary Examiner*—Anh Phung
*Assistant Examiner*—Tha-O Bui
(74) *Attorney, Agent, or Firm*—Volentine & Whitt, PLLC

(57) ABSTRACT

A method of programming a nonvolatile memory device using hybrid local boosting which includes a plurality of cell strings each having a plurality of electrically erasable and programmable memory cells connected in series and a plurality of wordlines respectively connected to control gates of the plurality of memory cells. The address of a selected cell that is to be programmed is received. A determination is made as to whether a selected wordline connected to the selected cell is located above or under a reference wordline based on the received address. The selected cell is programmed using local boosting when the selected wordline corresponds to the reference wordline or is located above the reference wordline. The selected cell is programmed using self-boosting when the selected wordline is located under the reference wordline. The programming method reduces circuit size of a nonvolatile memory device employing the programming method and efficiently prevents program disturbance due to charge sharing.

28 Claims, 10 Drawing Sheets

(a)  (b)

METHOD OF PROGRAMMING A NONVOLATILE MEMORY DEVICE USING HYBRID LOCAL BOOSTING

CROSS-REFERENCE TO RELATED APPLICATION

This U.S. non-provisional patent application claims priority under 35 U.S.C. §119 of Korean Patent Application No. 10-2006-006997 filed on Jul. 25, 2006, the entire contents of which are hereby incorporated by reference.

BACKGROUND OF THE INVENTION

1. Field of the Invention

Embodiments of the invention relate to a method of programming a nonvolatile memory device. More particularly, embodiments of the invention relate to a method of programming a nonvolatile memory device through hybrid boosting using both self-boosting and local boosting.

2. Discussion of Related Art

A nonvolatile memory device, for example a flash memory, is electrically erasable and programmable and can preserve data even in the absence of power. One type of flash memory is a NAND type which has a string structure in which a plurality of flash memory cells is connected in series. NAND type flash memories can be easily integrated in and supplied at a low cost making it a typical choice for use in a variety of portable electronic devices.

Cell transistors of a flash memory are erased according to an F-N tunneling mechanism. In particular, a cell transistor is erased by applying a ground voltage to the control gate of the cell transistor and applying a voltage higher than a power supply voltage to a semiconductor substrate (or bulk). Under this erase bias condition, a large voltage difference between the floating gate and the bulk forms a strong electric field between the floating gate and the bulk. As a result, electrons existing in the floating gate region are discharged to the bulk according to the F-N tunneling effect and the threshold voltage of the erased cell transistor is shifted in the negative direction.

Cell transistors of a flash memory are programmed by applying a voltage, higher than the power supply voltage, to the control gate of the cell transistor and a ground voltage is applied to the drain of the cell transistor and the bulk. Under this bias condition, electrons are injected into the floating gate of the cell transistor according to the F-N tunneling effect. The threshold voltage of the programmed cell transistor is shifted in the positive direction.

FIG. 1 is a block diagram of a NAND type flash memory device 100 including memory cell array 110, row decoder 130 and page buffer circuit 150. Memory cell array 110 includes a plurality of memory blocks (not shown) each having a plurality of strings 110_1-110_M in a column direction. FIG. 1 illustrates only one memory block for convenience of explanation. Each of the strings 110_1-110_M includes a string selecting transistor SST, a ground selecting transistor GST and a plurality of memory cell transistors MCT<0>-MCT<N-1> which are serially connected between string selecting transistor SST and ground selecting transistor GST. The gate of string selecting transistor SST is connected to string selection line SSL and the drain of string selecting transistor SST is connected to a bit line (BLe or BLo). The gate of ground selecting transistor GST is connected to a ground selection line GSL and the source of ground selecting transistor GST is connected to a common source line CSL. The control gates of the plurality of memory cell transistors MCT<0>-MCT<N-1> are respectively connected to wordlines WL<0>-WL<N-1>.

The voltages of the string selection line SSL, the wordlines WL<0>-WL<N-1> and the ground selection line GSL are controlled by row decoder 130 in response to a predetermined timing control signal (not shown). The voltages of the bit line pair BLe and BLo are respectively controlled by page buffers (not shown) included in page buffer circuit 150. The operation of controlling the string selection line SSL, the wordlines WL<0>-WL<N-1>, the ground selection line GSL and the operation of controlling bit line pair BLe and BLo are well known.

FIG. 2 is a graph illustrating the relationship between a cell state and a cell voltage in a multi-level nonvolatile memory device. Reference 11 represents an erased state and 10, 00 and 01 represent a programmed state. The erased state is distinguished from the programmed state by the threshold voltage of a cell transistor. The operation of erasing or programming cell transistors of a multi-level nonvolatile memory device is well known in the art. Self-boosting is a typical method of programming a nonvolatile memory device. FIG. 3 is a timing diagram illustrating the self-boosting method. The operation of programming a cell transistor will be explained with reference to FIGS. 1, 2 and 3. The control gates of cell transistors MCT<0>-MCT<N-1> are respectively connected to wordlines WL<0>-WL<N-1>. Referring to FIG. 3, a pass voltage VPASS, which is lower than a program voltage VPGM, is applied to the control gates of cell transistors MCT<0>-MCT<N-1> in an initial period B of the programming operation. In period C, program voltage VPGM is applied to a selected cell transistor MCT<I> to program the cell. All the cell strings included in a single memory block are commonly connected to wordlines WL<0>-WL<N-1>. Accordingly, when a selected cell transistor is programmed, the program voltage is also applied to the cell transistors of the other cell strings connected to the selected cell transistor so that the states of the cell transistors of the other cell strings are likewise disturbed.

FIG. 4 is a diagram for explaining program disturbance that can occur in a cell string in which all the cells (cell transistors) are erased in a self-boosting method. FIG. 5 is a diagram for explaining program disturbance that can occur in a cell string in which parts of the cells are programmed in the self-boosting method. FIGS. 4 and 5 illustrate neighboring cell strings where each cell string includes 32 cell transistors, a program voltage is applied to the twenty-ninth wordline WL<28> to program memory cells X and Z, and lower memory cells are programmed first. Referring to FIG. 4, 0V is applied to a cell string (program string) including a cell X that is to be programmed through bit line BLo and a program voltage VPGM is applied to the cell string through the wordline WL<28> to program cell X. A power supply voltage VCC is applied to a cell string (inhibited string) including cell W connected to the same wordline WL<28> to which cell X is connected through bit line BLe and the program voltage VPGM is applied to the inhibited string through wordline WL<28>. A boosting channel, which has a high voltage maintained according to a boosting voltage caused by a pass voltage VPASS applied to the wordlines other than the wordline WL<28> and a boosting voltage caused by the program voltage VPGM, is formed in the bulk of the inhibited cell string. Consequently, F-N tunneling is inhibited in cell W to disturb programming of cell W. The cells located under cell W are erased. The threshold voltages of the cell transistors have a negative value in the erased state, as illustrated in FIG. 2, so that boosting efficiency in the cell string including the cell transistors is improved. Accordingly, a high voltage sufficient to inhibit F-N tunneling is maintained in cell W.

As illustrated in FIG. 5, when cells located under a cell Y connected to the same wordline WL<28> to which the programmed cell Z is connected are programmed, the threshold voltages of cell transistors has a predetermined positive value so that boosting efficiency in the cell string including the cell transistors is decreased. Accordingly, F-N tunneling may occur in cell transistor Y under certain circumstances. It is assumed that the cells located under cell Y are programmed to 00. However, the cells can be programmed to other states.

When the cells located under cell Y are programmed to 00, the boosting voltage according to the program voltage VPGM in cell Y and the boosting voltage according to pass voltage VPASS in the cells located above cell Y are maintained high. However, boosting efficiency according to pass voltage VPASS in the cells under cell Y is decreased so that the voltage of the bulk of the cell string is reduced according to a charge sharing effect. A boosting channel having a low voltage is formed in the bulk of the cell string.

Accordingly, the bulk voltage in cell Y is decreased and a high program voltage VPGM is applied to wordline WL<28> connected to cell Y which programs cell Y that was not intended to be programmed This phenomenon is referred to as program disturbance. Particularly, when programming is performed from lower cells to upper cells, the program disturbance is aggravated when a selected cell is close to the upper cells because the number of cells bringing about charge sharing is increased. Therefore, there is a need to prevent the program disturbance when programming a nonvolatile memory device.

SUMMARY OF THE INVENTION

Exemplary embodiments of the present invention are directed to a method of programming a nonvolatile memory device. In an exemplary embodiment, the programming method employs hybrid boosting using both self-boosting and local boosting. The nonvolatile memory device includes a plurality of cell strings each having a plurality of electrically erasable and programmable memory cells connected in series and a plurality of wordlines respectively connected to control gates of the plurality of memory cells. The method includes receiving an address of a selected one of the plurality of memory cells to be programmed. A determination is made whether or not a selected wordline connected to the selected cell is located above or under a reference wordline based on the received address. The selected cell is programmed in a local boosting manner when the selected wordline corresponds to the reference wordline or is located above the reference wordline. The selected cell is programmed in a self-boosting manner when the selected wordline is located under said reference wordline.

DESCRIPTION OF EMBODIMENTS

Figure 1:
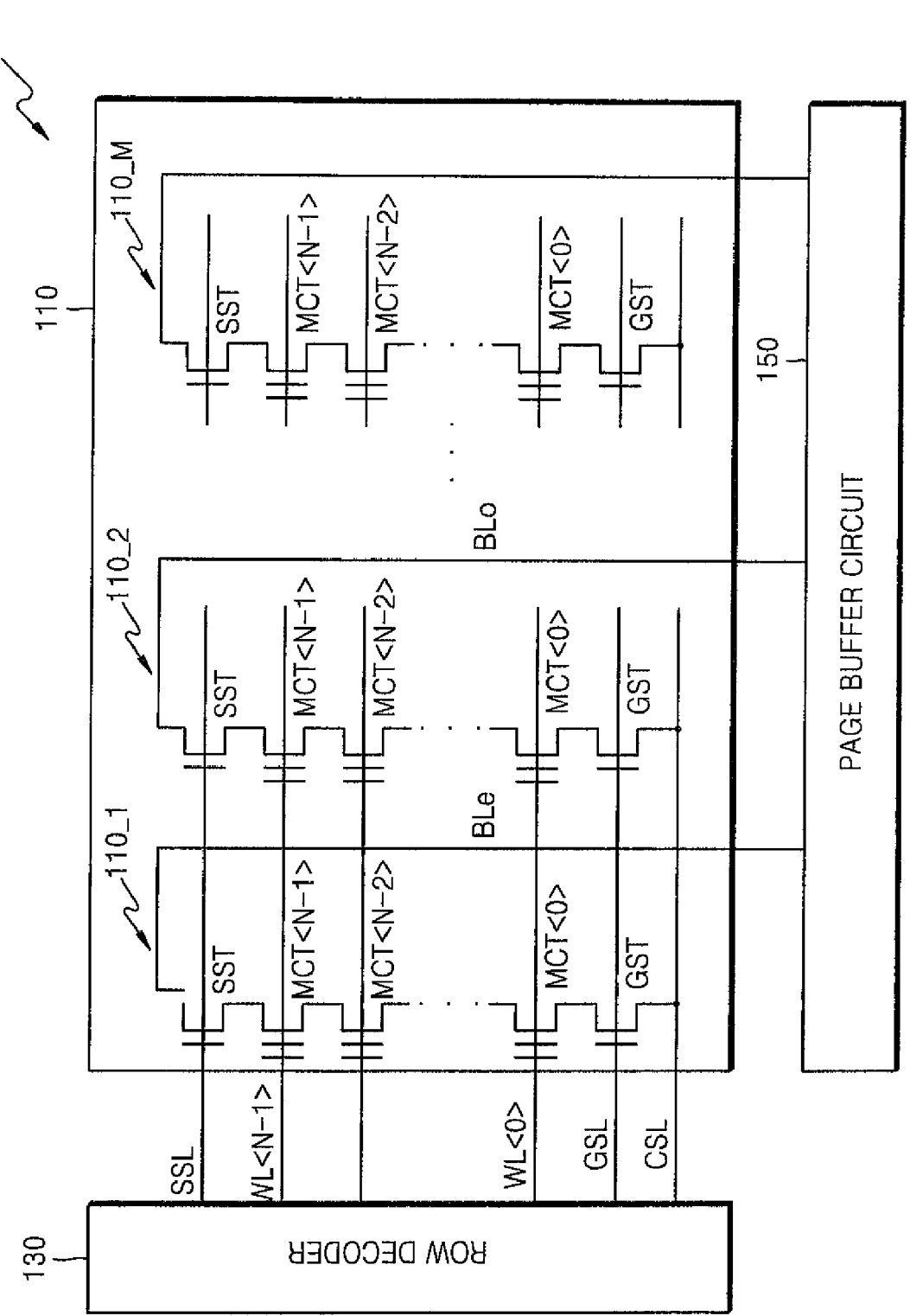
FIG. 1 is a block diagram of a nonvolatile memory device.
Figure 2:
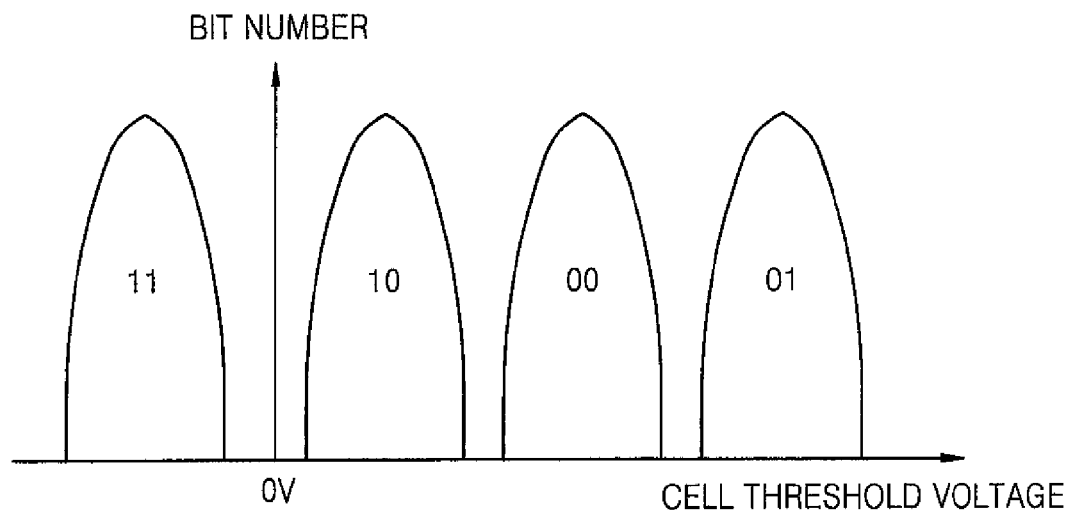
FIG. 2 is a graph illustrating the relationship between a cell state and a cell voltage in a nonvolatile memory device.
Figure 3:
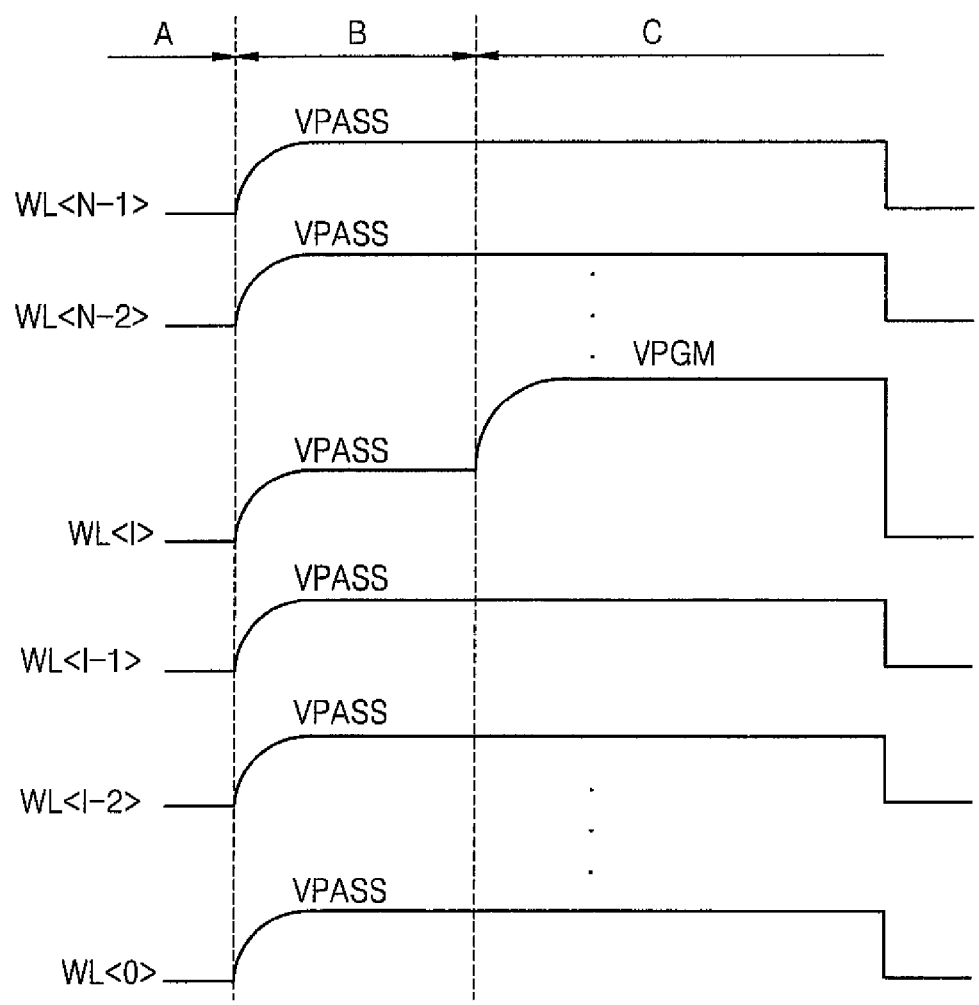
FIG. 3 is a timing diagram for explaining self-boosting.
Figure 4:
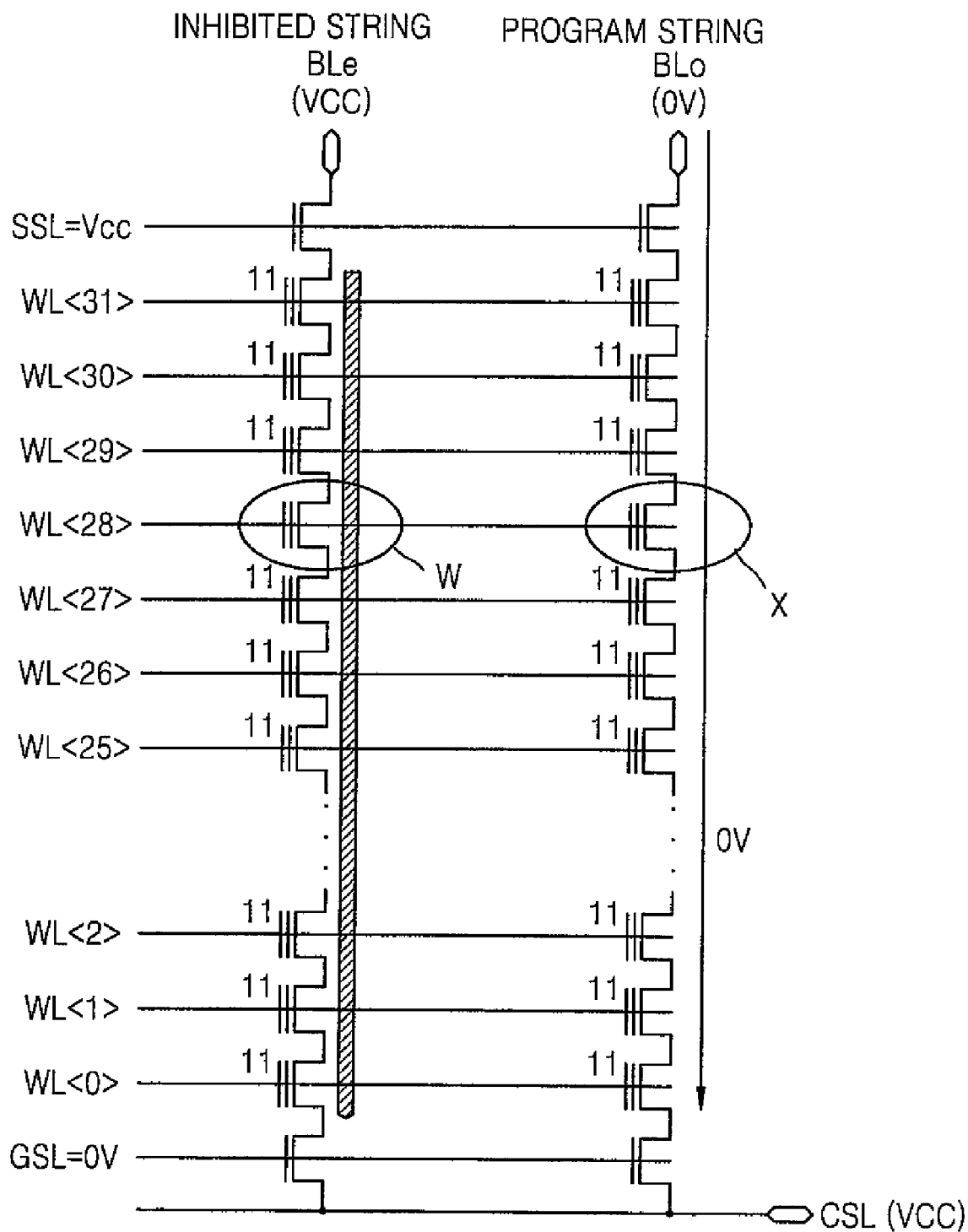
FIG. 4 is a diagram for explaining program disturbance that may occur in a cell string in which cells are all erased in the self-boosting method.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 6:
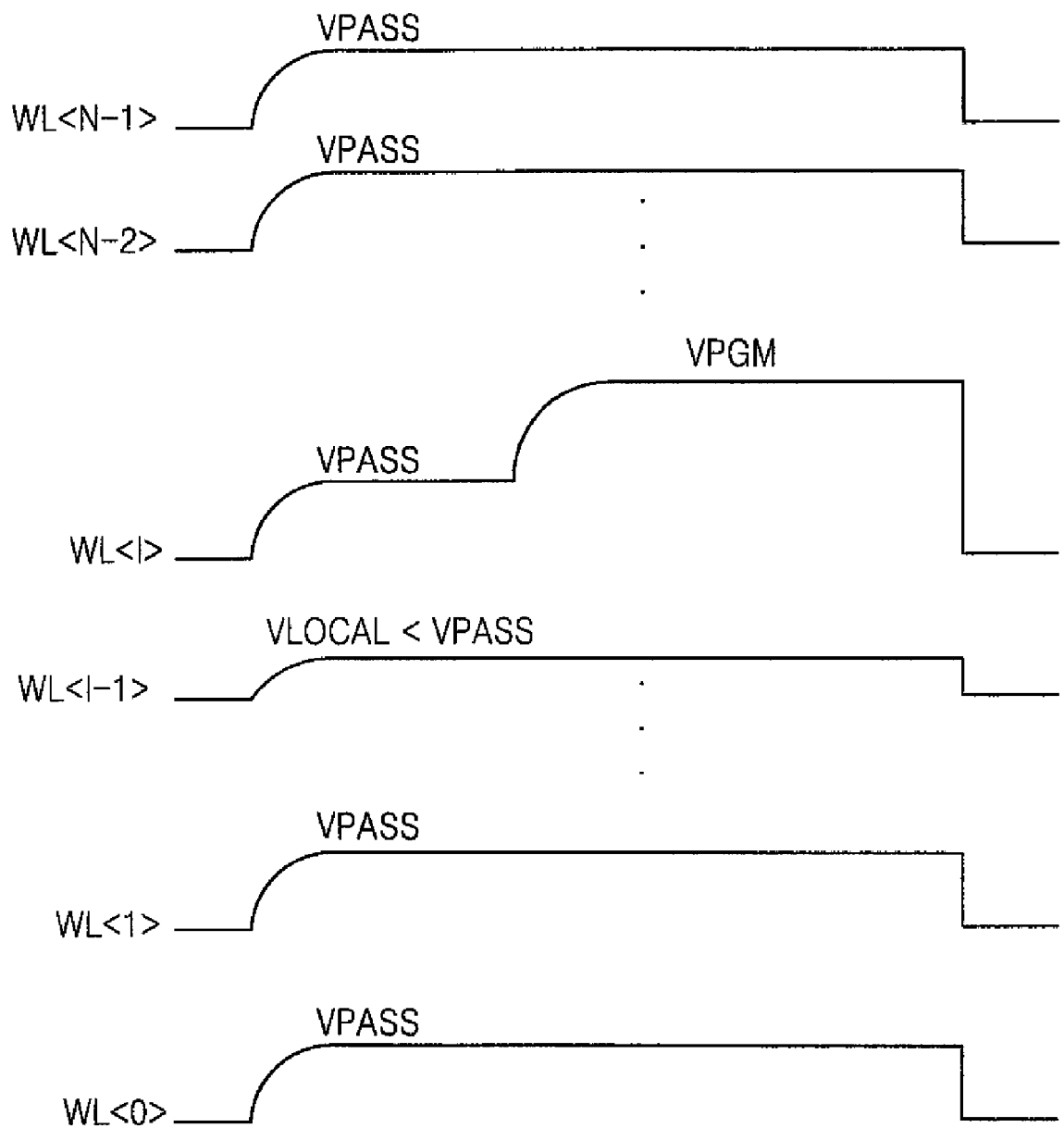
FIG. 6 is a timing diagram for explaining local boosting.

FIG. 6 is a timing diagram for explaining the local boosting method. Local voltage VLOCAL is applied to wordline WL<I-1> connected application to a cell directly under a programmed cell (i.e. a cell connected to a wordline WL<I>). The wordline WL<I-1> to which the local voltage is applied is operated in connection with wordline WL<I> to which the program voltage is applied. Although FIG. 6 depicts local voltage VLOCAL applied to wordline WL<I-1> connected to the cell right under the programmed cell connected to wordline WL<I>, local voltage VLOCAL can be applied to the wordline connected to a cell located a predetermined number of cell transistors under the programmed cell connected to wordline WL<I>. While a single local voltage is used, a plurality of local voltages may also be employed and the plurality of local voltages can have the same level or different levels.

When a voltage difference between neighboring wordlines is large, an abnormal operation such as coupling may occur. To prevent this abnormality, a voltage in the range of 0V to the program voltage may be used for the wordlines. Again, the local voltage has to be provided to wordlines other than the uppermost wordline WL<N-1> in the local boosting. Thus, when a wordline driver circuit is constructed in the local boosting manner, units that drive the wordlines other than the uppermost wordline WL<N-1> must provide the local voltage. Accordingly, the design of the wordline driver circuit employing the local boosting is more complicated than the circuit design of a wordline driver circuit employing the self-boosting such that the size of the wordline driver circuit employing the local boosting is increased.

Figure 7:
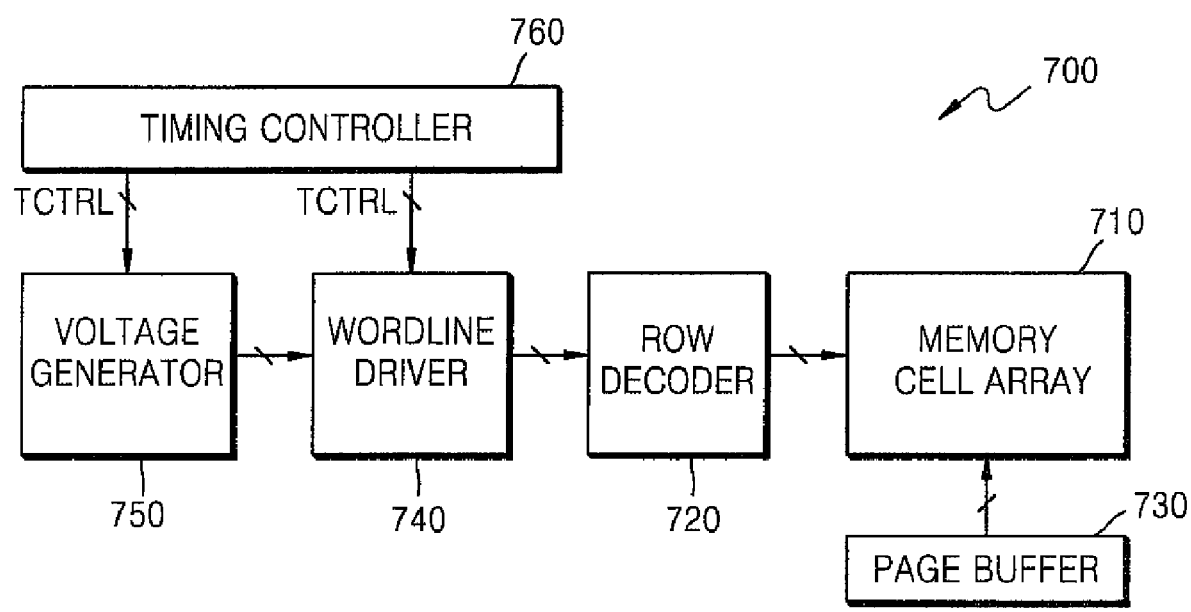
FIG. 7 is a block diagram of a nonvolatile memory device according to an embodiment of the present invention.

Embodiments of the present invention use a hybrid local boosting method which utilizes the advantages of local boosting that prevents program disturbance and self-boosting in terms of circuit design. FIG. 7 is a block diagram of nonvolatile memory device 700 that includes memory cell array 710 having a plurality of wordlines (shown in FIG. 1), voltage generator 750, wordline driver 740, row decoder 720, timing controller 760, and page buffer 730. Memory cell array 710 and associated wordlines (not shown) are identical to memory cell array 110 and wordlines WL<0>-WL<N-1> illustrated in FIG. 1.

Referring briefly to FIG. 1, memory cell array 710 includes a plurality of cell strings 110-1 through 110-M each having a plurality of electrically programmable and erasable memory cells connected in series. The plurality of wordlines WL<0>-WL<N-1> are respectively connected to control gates of the plurality of memory cells. The configurations and operations of the memory cell array 710, the wordlines and page buffer 730 are well known in the art so that detailed explanation thereof is omitted. Voltage generator 750 generates operating voltages applied to the plurality of wordlines WL<0>-WL<N-1> in response to a timing control signal TCTRL. Wordline driver 740 outputs corresponding voltages from among the operating voltages generated by voltage generator 750 in response to timing control signal TCTRL according to an operating state of memory device 700. The operations of the voltage generator 750 and wordline driver 740 will be explained later with reference to FIGS. 9 and 10.

Row decoder 720 applies the corresponding voltages output from wordline driver 740 to the corresponding wordlines. The timing control circuit 760 generates the timing control signal TCTRL in response to the operating state of the memory device 700. The timing control signal TCTRL controls voltage generator 750 to generate and output operating voltages according to the operating state of memory device 700. For example, timing control signal TCTRL applies 0V to a selected wordline and maintains de-selected wordlines in a floating state during an erase or program operation. In a read operation, timing control signal TCTRL applies 0V to the selected wordline and applies a read voltage to the de-selected wordlines.

Figure 5:
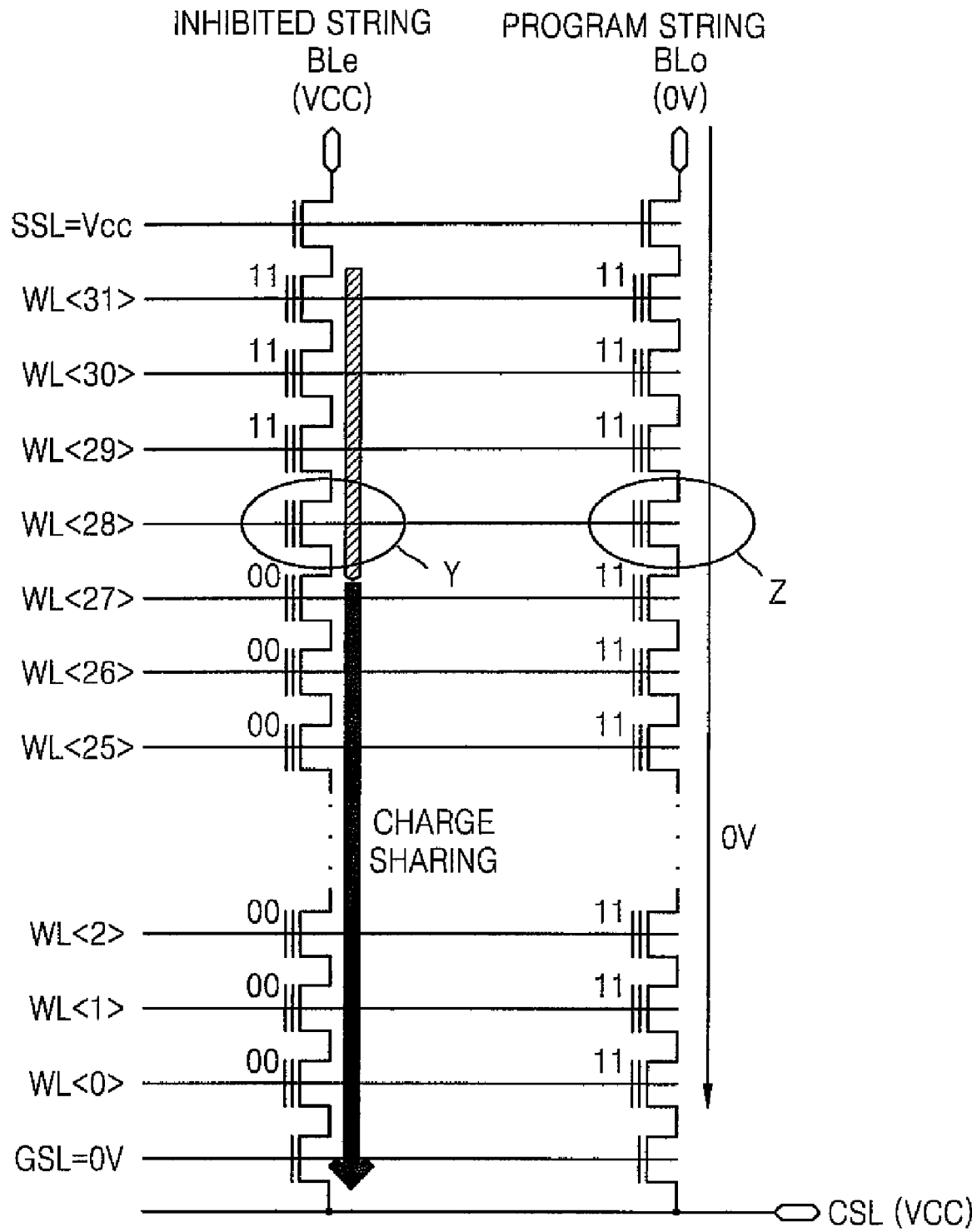
FIG. 5 is a diagram for explaining program disturbance that may occur in a cell string in which parts of cells are programmed in the self-boosting method.

Timing control signal TCTRL controls predetermined operating voltages to be applied to the wordlines in response to other operating states of memory device 700. The control operation according to timing control signal TCTRL is well known in the art. In the self-boosting programming method, as described above with reference to FIG. 5, program disturbance due to charge sharing occurs in cell strings (inhibited strings) other than a cell string (program string) including a programmed cell Z when cells located under a cell Y connected to a wordline WL<28> to which the programmed cell Z is connected are programmed to 00. In particular, program disturbance is aggregated in upper cells when programming is carried out from the lower cells. However, program disturbance is reduced in lower cells and, even when a bulk voltage is decreased due to charge sharing in cells located under a predetermined cell, F-N tunneling is not generated in cell strings that are not selected. The present invention sets a reference wordline connected to a predetermined cell in which F-N tunneling is not generated even when the bulk voltage is reduced due to charge sharing, and then programs cells located above the reference wordline using local boosting to prevent program disturbance caused by charge sharing and programs cells located under the reference wordline using self-boosting. Here, the reference wordline is experimentally determined in advance according to a manufacturing process of a nonvolatile memory device and manufacturing environment.

Figure 8:
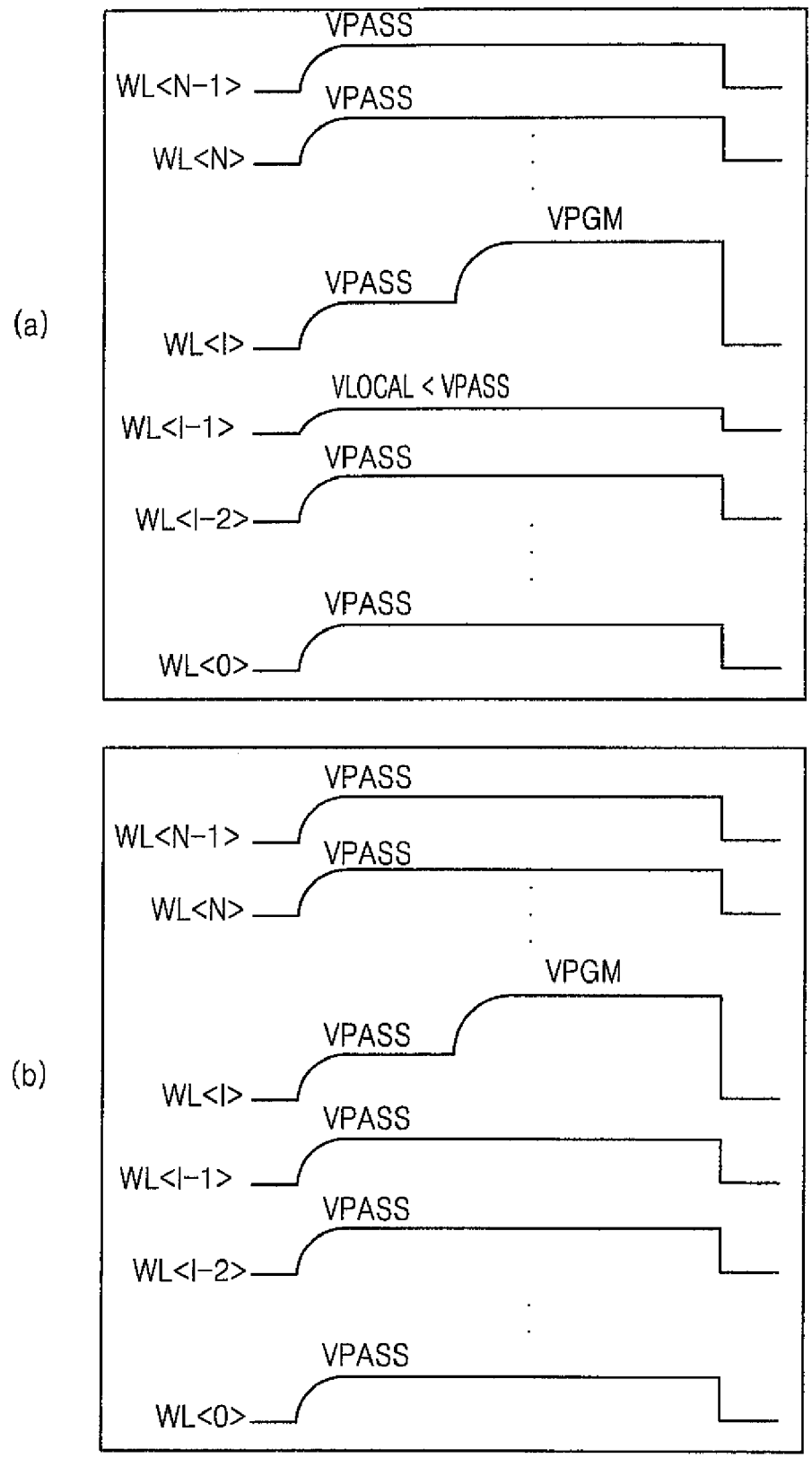
FIG. 8 is a timing diagram for explaining a programming method according to an embodiment of the present invention.

FIG. 8 is a timing diagram to explain a programming method where timing controller 760 receives the address of a selected cell that is to be programmed and determines whether a selected wordline WL<I> to which the selected cell is connected is located above or under a reference wordline (not shown) based on the address. When the selected wordline WL<I> is located above the reference wordline, timing controller 760 generates a timing control signal TCTRL for controlling the selected cell to be programmed using local boosting. FIG. 8A is a timing diagram of a programming method using the local boosting where local voltage VLOCAL is applied to wordline WL<I-1> right under the selected word-line WL<I> and pass voltage VPASS is applied to the other wordlines. The wordline to which local voltage VLOCAL is applied operates with selected wordline WL<I>.

While local voltage VLOCAL is applied to wordline WL<I-> right under the selected wordline WL<I> in FIG. 8A, local voltage VLOCAL can be applied to at least one of the wordlines located above or under selected wordline WL<I>. That is, local voltage VLOCAL can be applied to the wordline right above the selected wordline WL<I> or a wordline located a predetermined number of wordlines above or under the selected wordline WL<I>. Additionally, local voltage VLOCAL can be applied to more than one wordline. When local voltage VLOCAL is applied to at least two wordlines, the local voltages applied to the respective wordlines can have one level where the same local voltage VLOCAL can be applied to the at least two wordlines or different local voltages VLOCAL can be respectively applied to the at least two wordlines.

It is also possible to divide local wordlines into a plurality of groups and apply different local voltages to the respective groups. When four local wordlines are used, for example, they are divided into two groups and different local voltages are applied to the respective groups It is preferable that at least one wordline to which the local voltage is applied is adjacent to the reference wordline or is located above the reference wordline.

When the selected wordline WL<I> is under the reference wordline, timing controller 760 generates a timing control signal TCTRL for controlling the selected cell to be programmed using the self-boosting method. FIG. 8B is a timing diagram of a programming method using the self-boosting. When the selected wordline WL<I> is the reference wordline, either self-boosting or local boosting can be used. However, local boosting is preferable in order to prevent program disturbance as described above.

Figure 9:
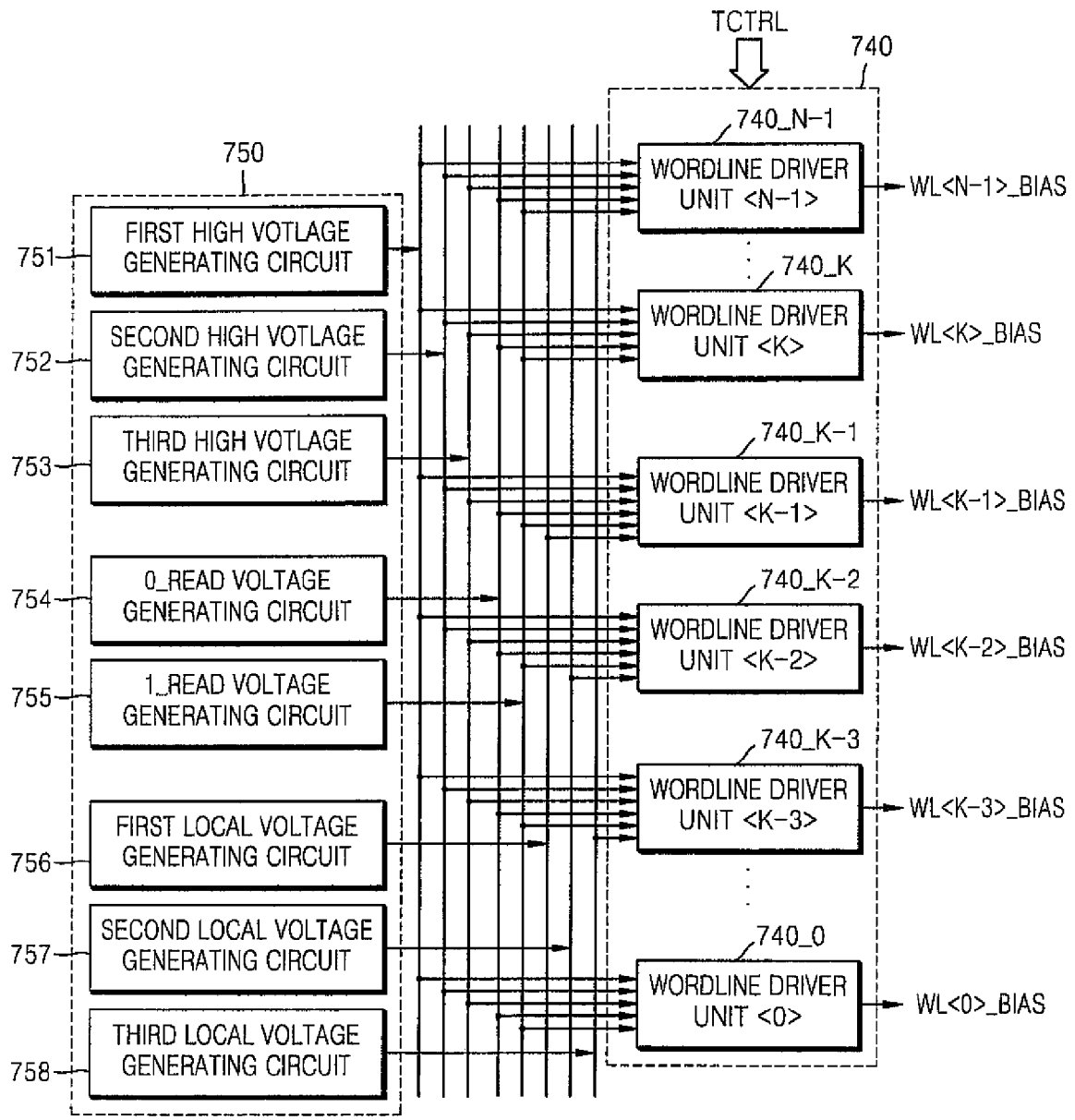
FIG. 9 is a block diagram of a voltage generator and a wordline driver illustrated in FIG. 7.

FIG. 9 is a block diagram of voltage generator 750 and wordline driver 740 illustrated in FIG. 7. Voltage generator 750 includes first, second and third high voltage generating circuits 751, 752 and 753 generating at least one high voltage, a 0_read voltage generating circuit 754 and a 1_read voltage generating circuit 755 generating at least one read voltage. Voltage generator 750 further includes first, second and third local voltage generating circuits 756, 757 and 758 generating at least one local voltage. The high voltage includes program voltage VPGM, pass voltage VPASS and read-out voltage VREAD. The read voltage includes a 0_read voltage VLEVEL_0, and a 1_read voltage VLEVEL_1. First high voltage generating circuit 751 generates program voltage VPGM. Second high voltage generating circuit 752 generates pass voltage VPASS. Third high voltage generating circuit 753 generates read-out voltage VREAD. The 0_read voltage generating circuit 754 generates 0_read voltage VLEVEL_0. The 1_read voltage generating circuit 755 generates 1_read voltage VLEVEL_1. First, second and third local voltage generating circuits 756, 757 and 758 generate the three local voltages.

Wordline driver 740 includes a plurality of wordline driver units 740_0 through 740_N-1 corresponding to the plurality of wordlines WL<0> through WL<N-1>. The plurality of wordline driver units 740_0 through 740_N-1 output wordline bias signals WL<0>_BIAS through WL<N-1>_BIAS to be applied to the respective wordlines WL<0> through WL<N-1> to row decoder 720. Row decoder 720 applies wordline bias signals WL<0>_BIAS through WL<N-1>_BIAS output from the plurality of wordline driver units 740_0 through 740_N-1 to the respective wordlines WL<0> through WL<N-1>. Wordline bias signals WL<0>_BIAS through WL<N-1>_BIAS are output in response to timing control signal TCTRL according to an operating state of the memory device and selected from the operating voltage signals including program voltage VPGM, pass voltage VPASS, read-out voltage VREAD, the 0_read voltage VLEVEL_0, the 1_read voltage VLEVEL-1, and the first, second and third local voltages.

Figure 10:
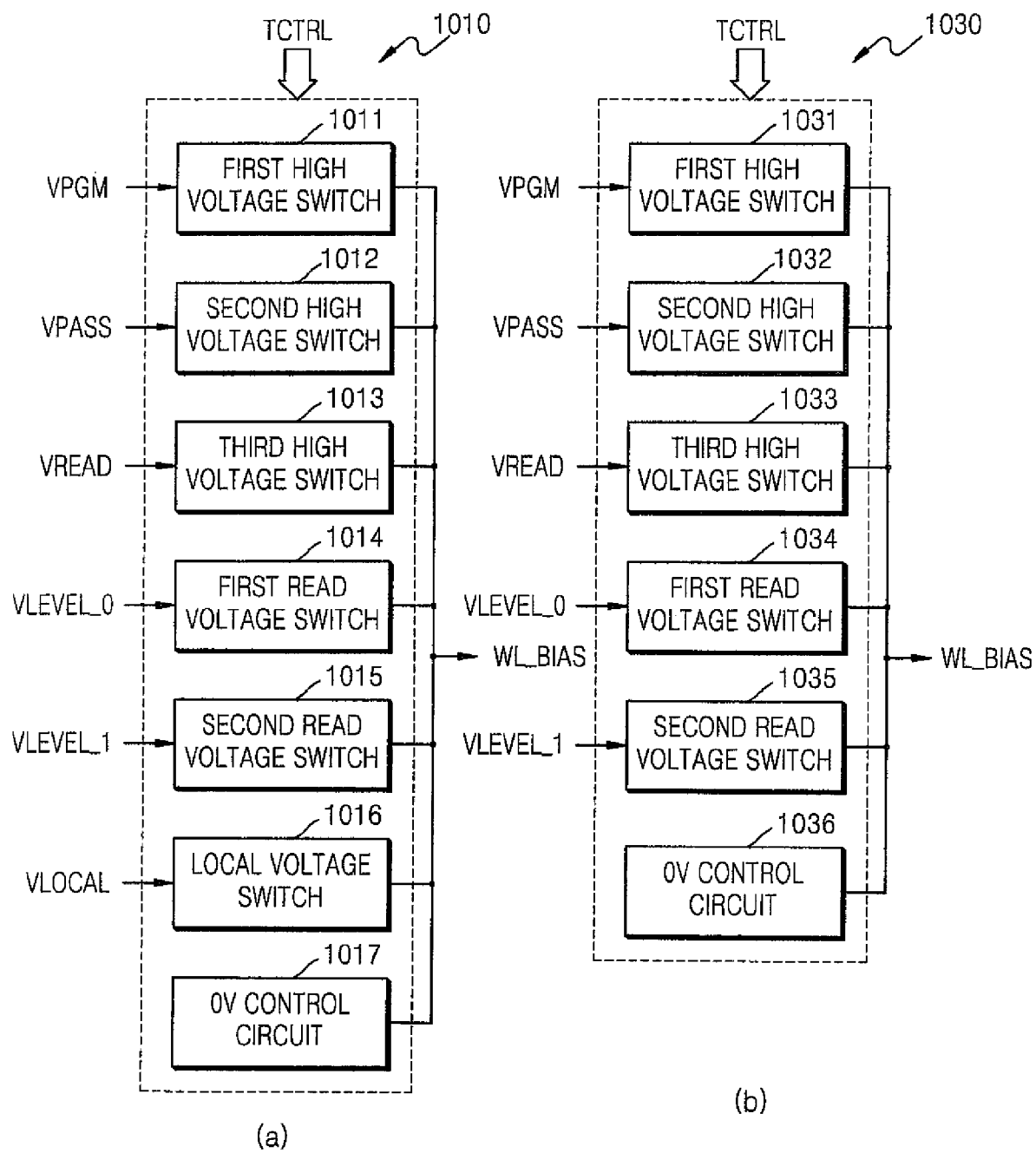
FIG. 10 is a block diagram of a wordline driver unit illustrated in FIG. 9.

FIG. 10 is a block diagram of the wordline driver unit referenced in FIG. 9. FIG. 10A illustrates wordline driver unit 1010 capable of outputting local voltage VLOCAL. In the present embodiment, local boosting is used when the selected wordline WL<I> corresponds to the reference wordline WL<K> or is located above the reference wordline WL<K>. Accordingly, when the programming method illustrated in FIG. 8 is employed, the wordline driver units corresponding to wordlines including wordline WL<K-1> located directly under reference wordline WL<K> and the wordlines above wordline WL<K-1> have the configuration illustrated in FIG. 10A. Wordline driver units corresponding to the other wordlines, namely wordlines located under wordline WL<K-1>, have the configuration illustrated in FIG. 10B.

Referring to FIGS. 9 and 10A, wordline driver unit 1010 is capable of outputting at least one high voltage, at least one read voltage and at least one local voltage in response to timing control signal TCTRL. In particular, wordline driver unit 1010 includes at least one high voltage switch 1011, 1012 and 1013 switching and outputting at least one high voltage (that is, the program voltage VPGM, pass voltage VPASS and read-out voltage VREAD) in response to timing control signal TCTRL. Wordline driver unit 1010 includes at least one read voltage switch 1014 and 1015 switching and outputting at least one read voltage (the 0_read voltage VLEVEL_0 and the 1_read voltage VLEVEL_1) in response to timing control signal TCTRL. Wordline driver unit 1010 also includes at least one local voltage switch 1016 switching and outputting at least one local voltage VLOCAL in response to timing control signal TCTRL, and a 0V control circuit 1017 switching and outputting 0V in response to timing control signal TCTRL. In this manner, signal WL_BIAS output from wordline driver unit 1010 corresponds to one of the operating voltage signals, that is, the program voltage VPGM, the pass voltage VPASS, the read-out voltage VREAD, the 0_read voltage VLEVEL_0, the 1_read voltage VLEVEL_1 and the local voltage VLOCAL.

FIGS. 9 and 10B illustrate wordline driver unit 1030 corresponding to wordlines located under wordline WL<K-1>. Wordline driver unit 1030 outputs one of at least one high voltage and at least one read voltage in response to timing control signal TCTRL. In particular, wordline driver unit 1030 includes at least one high voltage switch 1031, 1032 and 1033 switching and outputting at least one high voltage (that is, the program voltage VPGM, the pass voltage VPASS and the read-out voltage VREAD) in response to timing control signal TCTRL. Wordline driver unit 1030 also includes at least one read voltage switch 1034 and 1035 switching and outputting at least one read voltage (that is, the 0_read voltage VLEVEL_0 and the 1_read voltage VLEVEL_1) in response to timing control signal TCTRL. Wordline driver unit further includes a 0V control circuit 1036 switching and outputting 0V in response to timing control signal TCTRL. In this manner, signal WL_BIAS output from wordline driver unit 1030 corresponds to one of the operating voltage signals, that is, the program voltage VPGM, the pass voltage VPASS, the read-out voltage VREAD, the 0_read voltage VLEVEL_0 and the 1_read voltage VLEVEL_1. Since local voltage VLOCAL is not applied to uppermost wordline WL<N-1>, wordline driver unit 740_N-1 corresponding to the uppermost wordline WL<N-1> has the configuration illustrated in FIG. 10B.

The aforementioned embodiment can be applied to a single level nonvolatile memory device and a multi-level nonvolatile memory device. Accordingly, a nonvolatile memory cell can be a single level cell or a multi-level cell.

Figure 11:
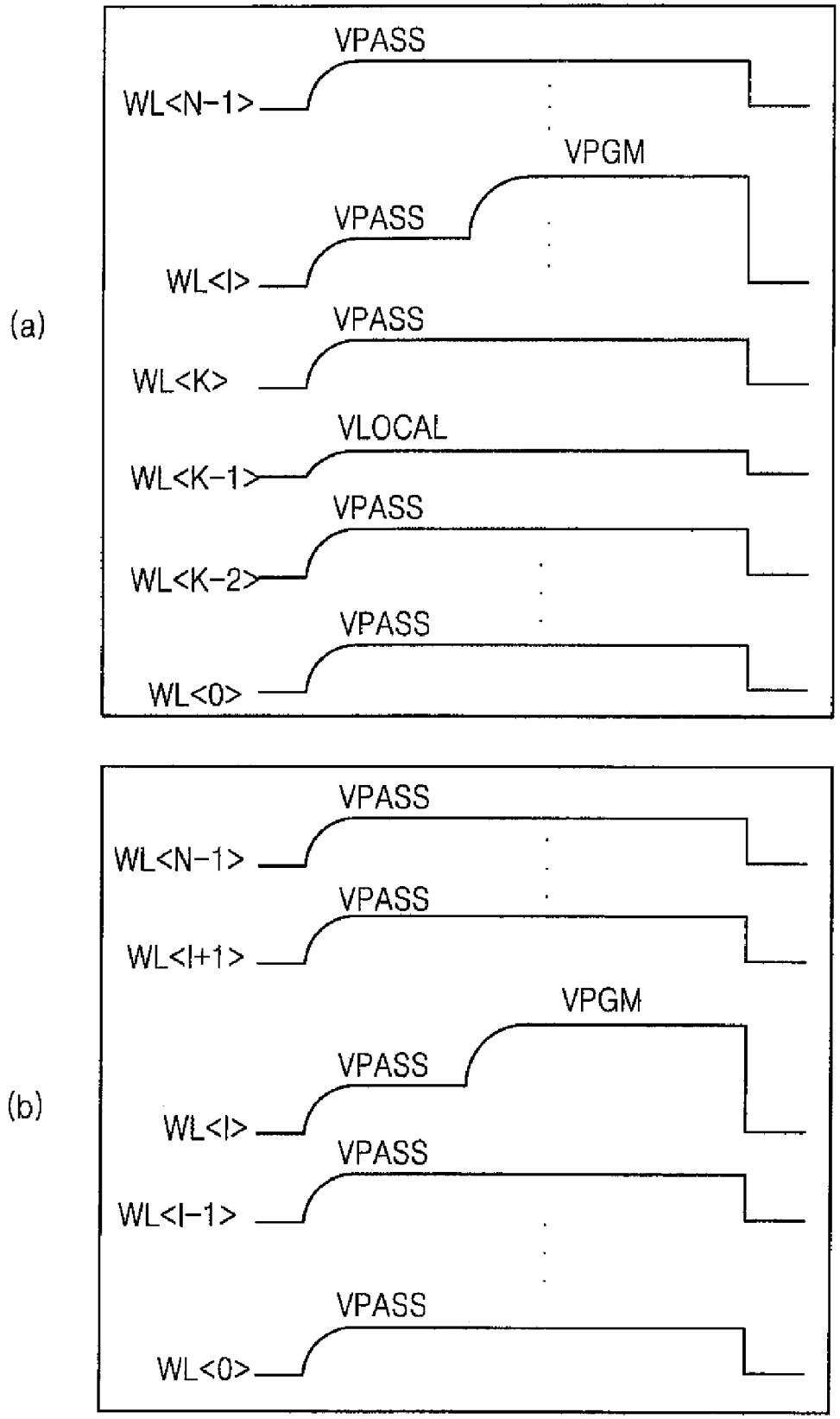
FIG. 11 is a timing diagram for explaining a programming method according to another embodiment of the present invention.

FIG. 11A illustrates a programming method employing local boosting and FIG. 11B illustrates a programming method employing self-boosting. Compared to the embodiment illustrated in FIG. 8, local voltage VLOCAL is applied to a predetermined wordline WL<K-1>. Accordingly, timing controller 760 generates a timing control signal TCTRL that controls a selected cell to be programmed in the local boosting manner when a selected wordline WL<I> connected to the selected cell is located above reference wordline WL<K>. Timing control signal TCTRL controls local voltage VLOCAL to be applied to predetermined local wordline WL<K-1>.

While local voltage VLOCAL is applied to wordline WL<K-1> located directly under reference wordline WL<K> in FIG. 11A, local voltage VLOCAL can be applied to at least one wordline from among wordlines located above or under reference wordline WL<K>. That is, local voltage VLOCAL can be applied to the wordline right above reference wordline WL<K> or a wordline located a predetermined number of wordlines above or under reference wordline WL<K>. Furthermore, local voltage VLOCAL can be applied to at least two wordlines. When local voltage VLOCAL is applied to at least two wordlines, the local voltages applied to the respective wordlines can have at least one level where the same local voltage VLOCAL can be applied to the at least two wordlines or different local voltages VLOCAL can be respectively applied to the at least two wordlines. Alternatively, local wordlines may be divided into a plurality of groups and different local voltages may be applied to the respective groups. When four local wordlines are used, for example, the four local wordlines are divided into two groups and different local voltages are applied to each group. It is preferable that at least one wordline to which the local voltage is applied is adjacent to or neighbors the reference wordline or is located above the reference wordline. When the selected wordline WL<I> is under the reference wordline, timing controller 760 generates timing control signal TCTRL for controlling the selected cell to be programmed in the self-boosting manner so that programming is carried out according to the timing diagram illustrated in FIG. 11B. When the selected wordline WL<I> corresponds to reference wordline WL<K>, the self-boosting and local boosting methods may be used. However, the local boosting is preferable in order to prevent the program disturbance as described above.

Although an embodiment compares the position of the selected wordline WL<I> to the position of the reference wordline WL<K> and the local boosting or self-boosting method is used, the present invention can also be applied to a method of programming a nonvolatile memory device without comparing the position of a selected wordline to the position of a reference wordline. For example, when a plurality of memory cells is programmed and the address of a selected cell that is to be programmed is received, a local voltage is applied to at least one wordline from among the wordlines located under or above the selected wordline connected to the selected cell in response to the received address and a pass voltage is applied to the other wordlines. After a predetermined time, a program voltage is applied to the selected wordline to program the selected cell. Alternatively, when the address of the selected cell to be programmed is received, a local voltage is applied to at least one predetermined local wordline and a pass voltage is applied to the other wordlines. After a predetermined time, a program voltage is applied to the selected wordline connected to the selected cell to program the selected cell.

As described above, the programming method according to the present invention can reduce the circuit size of a nonvolatile memory device employing the programming method and efficiently prevent program disturbance due to charge sharing.

Although the present invention has been described in connection with the embodiments of the present invention illustrated in the accompanying drawings, it is not limited thereto. It will be apparent to those skilled in the art that various substitution, modifications and changes may be made thereto without departing from the scope and spirit of the invention.

What is claimed is:

1. A method of programming a nonvolatile memory device having a plurality of cell strings each having a plurality of electrically erasable and programmable memory cells connected in series, and a plurality of wordlines respectively connected to control gates of said plurality of memory cells, the method comprising:
   receiving an address of a selected one of said plurality of memory cells to be programmed;
   determining whether a selected wordline connected to said selected cell is located above or under a reference wordline based on the received address;
   programming the selected cell in a local boosting manner when said selected wordline corresponds to the reference wordline or is located above the reference wordline; and
   programming said selected cell in a self-boosting manner when said selected wordline is located under said reference wordline.

2. The method of claim 1, wherein the programming of said selected cell in the local boosting manner comprises applying a local voltage to at least one of said wordlines located above or under said selected wordline.

3. The method of claim 2, wherein the wordline to which the local voltage is applied neighbors said reference wordline.

4. The method of claim 2 wherein the wordline to which the local voltage is applied is located above said reference wordline.

5. The method of claim 2 wherein when the local voltage is applied to at least two wordlines, different local voltages are applied to said at least two wordlines.

6. The method of claim 1 wherein the programming of said selected cell in the local boosting manner comprises applying the local voltage to at least one predetermined local wordline.

7. The method of claim 6 wherein the predetermined local wordline neighbors said reference wordline.

8. The method of claim 6 wherein the predetermined local wordline is located above said reference wordline.

9. The method of claim 6, wherein when the local voltage is applied to at least two local wordlines local voltages respectively applied to the respective local wordlines have one of a plurality of levels.

10. The method of claim 9, wherein the local wordlines are respectively provided with different local voltages.

11. The method of claim 9, wherein the local wordlines are divided into a plurality of groups and different local voltages are applied to the respective groups.

12. The method of claim 1, wherein said memory cells are single level cells.

13. The method of claim 1, wherein said memory cells are multi-level cells.

14. A nonvolatile memory device comprising:
   a memory cell array including a plurality of cell strings each having a plurality of electrically erasable and programmable memory cells connected in series;
   a plurality of wordlines respectively connected to corresponding control gates of each of said plurality of memory cells;
   a voltage generator generating operating voltages applied to said plurality of wordlines in response to a timing control signal;
   a wordline driver outputting corresponding voltages from among the operating voltages in response to said timing control signal;
   a row decoder applying the corresponding voltages output from said wordline driver to corresponding wordlines; and
   a timing controller generating the timing control signal for generating and outputting corresponding operating voltages in response to an operating state of the nonvolatile memory device, wherein said timing controller generates the timing control signal that controls a selected cell to be programmed in a local boosting manner when a selected wordline connected to the selected cell corresponds to a reference wordline or is located above the reference wordline and generates the timing control signal that controls the selected cell to be programmed in a self-boosting manner when the selected wordline is located under the reference wordline in a programming operation.

15. The nonvolatile memory device of claim 14, wherein the timing control signal that controls a selected cell to be programmed in a local boosting manner controls a local voltage to be applied to at least one of wordlines located above or under the selected wordline.

16. The nonvolatile memory device of claim 15, wherein the wordline to which the local voltage is applied neighbors said reference wordline or is located above the reference wordline.

17. The nonvolatile memory device of claim 15, wherein when the local voltage is applied to at least two wordlines different local voltages are applied to the respective wordlines.

18. The nonvolatile memory device of claim 14, wherein the timing control signal that controls the selected cell to be programmed in the local boosting manner controls the local voltage to be applied to at least one predetermined local wordline.

19. The nonvolatile memory device of claim 18, wherein the local wordline neighbors with the reference wordline or is located above the reference wordline.

20. The nonvolatile memory device of claim 18, wherein when the local voltage is applied to at least two local wordlines said local voltages respectively applied to said respective local wordlines have one of a plurality of levels.

21. The nonvolatile memory device of claim 20, wherein the local wordlines are respectively provided with different local voltages.

22. The nonvolatile memory device of claim 20, wherein the local wordlines are divided into a plurality of groups and different local voltages are applied to each of said groups.

23. The nonvolatile memory device of claim 14, wherein said voltage generator generates at least one high voltage, at least one read voltage and at least one local voltage in response to the timing control signal.

24. The nonvolatile memory device of claim 23, wherein said wordline driver further comprises:

a plurality of wordline driver units respectively corresponding to said plurality of wordlines, one of said plurality of said wordline driver units capable of outputting the local voltage in the programming operation from among the plurality of wordline driver units outputs one of the at least one high voltage, the at least one read voltage and the at least one local voltage in response to the timing control signal, each of the other wordline driver units outputs one of the at least one high voltage and the at least one read voltage in response to the timing control signal.

25. The nonvolatile memory device of claim 24, wherein said one of said plurality of wordline driver units capable of outputting the local voltage comprises:

at least one high voltage switch switching and outputting the at least one high voltage in response to the timing control signal;

at least one read voltage switch switching and outputting the at least one read voltage in response to the timing control signal;

at least one local voltage switch switching and outputting the at least one local voltage in response to the timing control signal, and each of the other wordline driver units comprises:

at least one high voltage switch switching and outputting the at least one high voltage in response to the timing control signal; and at least one read voltage switch switching and outputting the at least one read voltage in response to the timing control signal.

26. The nonvolatile memory device of claim 23, wherein the high voltage includes a program voltage, a pass voltage and a read-out voltage and the read voltage includes a 0_read voltage and a 1_read voltage.

27. The nonvolatile memory device of claim 14, wherein said memory cells are single level cells.

28. The nonvolatile memory device of claim 14, wherein said memory cells are multi-level cells.

* * * * *